(12) United States Patent
Naganawa

(10) Patent No.: US 9,763,345 B2
(45) Date of Patent: Sep. 12, 2017

(54) GAS BARRIER LAMINATED BODY, METHOD FOR PRODUCING SAME, MEMBER FOR ELECTRONIC DEVICE, AND ELECTRONIC DEVICE

(75) Inventor: Satoshi Naganawa, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/004,960

(22) PCT Filed: Feb. 27, 2012

(86) PCT No.: PCT/JP2012/054706
§ 371 (c)(1),
(2), (4) Date: Nov. 22, 2013

(87) PCT Pub. No.: WO2012/132696
PCT Pub. Date: Oct. 4, 2012

(65) Prior Publication Data
US 2014/0072798 A1    Mar. 13, 2014

(30) Foreign Application Priority Data

Mar. 30, 2011 (JP) ................................. 2011-075156

(51) Int. Cl.
*H05K 5/02* (2006.01)
*H05K 13/00* (2006.01)
(Continued)

(52) U.S. Cl.
CPC .......... *H05K 5/0213* (2013.01); *C23C 14/48* (2013.01); *C23C 16/30* (2013.01); *C23C 16/56* (2013.01);
(Continued)

(58) Field of Classification Search
USPC ........ 427/489, 496, 503, 525, 527; 428/336, 428/451
See application file for complete search history.

(56) References Cited

U.S. PATENT DOCUMENTS

2004/0253451 A1    12/2004  Kawashima et al.
2005/0019503 A1*   1/2005   Komada ....................... 427/569
(Continued)

FOREIGN PATENT DOCUMENTS

JP    09-143289    *   6/1997
JP    11-256338 A     9/1999
(Continued)

OTHER PUBLICATIONS

Hirotsu, JP 09-143289 Machine Translation, Jun. 3, 1997.*
(Continued)

*Primary Examiner* — Coris Fung
(74) *Attorney, Agent, or Firm* — Birch, Stewart, Kolasch & Birch, LLP

(57) ABSTRACT

Provided is a gas barrier laminate that can be produced inexpensively as compared with the case of using an inorganic film without requiring a complex production process, and exhibits an excellent gas barrier capability and excellent flexibility, and also provided are a method for producing the gas barrier laminate, an electronic device member that includes the gas barrier laminate, and an electronic device that includes the electronic device member. A gas barrier laminate including a base and a gas barrier layer, the gas barrier layer being provided on the base, the gas barrier layer being obtained by implanting ions into an organosilicon compound thin film formed by a CVD method that utilizes an organosilicon compound as a deposition raw material, a method for producing the gas barrier laminate, an electronic device member that includes the gas barrier laminate, and an (Continued)

electronic device that includes the electronic device member are provided.

7 Claims, 3 Drawing Sheets

(51) Int. Cl.
  *C23C 14/48* (2006.01)
  *C23C 16/30* (2006.01)
  *C23C 16/56* (2006.01)
  *H01J 37/32* (2006.01)
(52) U.S. Cl.
  CPC ........ *H01J 37/32412* (2013.01); *H05K 13/00* (2013.01); *Y10T 428/265* (2015.01)

(56) References Cited

U.S. PATENT DOCUMENTS

| | | | | |
|---|---|---|---|---|
| 2007/0197026 | A1* | 8/2007 | Takada | B65D 23/02 438/653 |
| 2008/0038484 | A1* | 2/2008 | Alcott | B05D 1/60 427/579 |
| 2009/0142935 | A1* | 6/2009 | Fukuzawa | C23C 16/345 438/792 |
| 2010/0104878 | A1* | 4/2010 | Matsuo | C03C 27/06 428/429 |
| 2010/0136789 | A1* | 6/2010 | Matz et al. | 438/687 |
| 2012/0041116 | A1* | 2/2012 | Hoshi | C23C 14/20 524/268 |
| 2012/0064321 | A1* | 3/2012 | Suzuki | C08J 7/123 428/219 |
| 2012/0108761 | A1 | 5/2012 | Hoshi et al. | |
| 2012/0121917 | A1* | 5/2012 | Hoshi et al. | 428/447 |
| 2013/0202900 | A1* | 8/2013 | Uemura et al. | 428/451 |

FOREIGN PATENT DOCUMENTS

| | | |
|---|---|---|
| JP | 2000-338901 A | 12/2000 |
| JP | 2003-340971 A | 12/2003 |
| JP | 2004-203935 A | 7/2004 |
| JP | 2004-314599 A | 11/2004 |
| JP | 2004-351832 A | 12/2004 |
| JP | 2005-96275 A | 4/2005 |
| JP | 2006-123307 A | 5/2006 |
| JP | 2007-307784 A | 11/2007 |
| JP | 2010-284845 A | 12/2010 |
| JP | 2011-718 A | 1/2011 |
| WO | WO2010-110304 * | 3/2010 |
| WO | WO2010093010 * | 8/2010 |
| WO | WO2010-107018 * | 9/2010 |
| WO | WO 2010/134611 A1 | 11/2010 |

OTHER PUBLICATIONS

BASF: Nitrogen, 2014.*
International Search Report, mailed Apr. 24, 2012, issued in PCT/JP2012/054706.

* cited by examiner (a)　　　　　　　　　　　(b)

(a)  (b)

(a)  (b)

(a)　　　　　　　　　(b)

GAS BARRIER LAMINATED BODY, METHOD FOR PRODUCING SAME, MEMBER FOR ELECTRONIC DEVICE, AND ELECTRONIC DEVICE

TECHNICAL FIELD

The invention relates to a gas barrier laminate that exhibits an excellent gas barrier capability and excellent flexibility, a method for producing the gas barrier laminate, an electronic device member that includes the gas barrier laminate, and an electronic device that includes the electronic device member.

BACKGROUND ART

In recent years, use of a transparent plastic film as a substrate instead of a glass sheet has been proposed for displays (e.g., liquid crystal display and electroluminescence (EL) display) in order to implement a reduction in thickness, a reduction in weight, an increase in flexibility, and the like.

However, since a plastic film tends to allow water vapor, oxygen, and the like to pass through as compared with a glass sheet, the elements provided in a display tend to deteriorate.

In order to solve this problem, Patent Document 1 proposes a flexible display substrate in which a transparent gas barrier layer formed of a metal oxide is stacked on a transparent plastic film.

However, since the transparent gas barrier layer formed of a metal oxide is stacked on the surface of the transparent plastic film by evaporation (deposition), ion plating, sputtering, or the like, cracks may occur in the gas barrier layer when the substrate is rolled up or bent, and the gas barrier capability may deteriorate. Moreover, since a solid raw material is used as the target, the raw material cost increases.

Patent Document 2 discloses a gas barrier laminate that includes a plastic film, and a resin layer that contains a polyorganosilsesquioxane as the main component and is stacked on at least one side of the plastic film.

However, since it is necessary to further stack an inorganic compound layer in order to obtain a gas (e.g., oxygen and water vapor) barrier capability, the process becomes complicated, and the production cost increases. Moreover, toxic gas may be used.

Patent Document 3 discloses a method for producing a gas barrier film wherein a thin film that contains silicon oxide as the main component is formed on a polymer film using a CVD method that utilizes plasma generated at a pressure of 600 to 1520 Torr using an organosilicon compound that is liquid at a temperature of 20 to 150° C. as a deposition raw material.

However, the gas barrier film obtained by the method disclosed in Patent Document 3 exhibits an insufficient gas barrier capability.

Patent Document 4 discloses a transparent gas barrier laminate film that is obtained by sequentially stacking a silicon oxide layer having a high degree of oxidation and a silicon oxide layer having a low degree of oxidation on a base using a dry coating method, subjecting the surface of the silicon oxide layer having a low degree of oxidation to a plasma treatment using oxygen gas or the like, and stacking a polymer layer on the plasma-treated surface of the silicon oxide layer having a low degree of oxidation.

However, since it is necessary to stack a plurality of layers in order to obtain the gas barrier laminate film, the production process is complex and economically disadvantageous.

RELATED-ART DOCUMENT

Patent Document

Patent Document 1: JP-A-2000-338901
Patent Document 2: JP-A-2006-123307
Patent Document 3: JP-A-11-256338
Patent Document 4: JP-A-2004-351832

SUMMARY OF THE INVENTION

Technical Problem

The invention was conceived in view of the above situation. An object of the invention is to provide a gas barrier laminate that can be produced inexpensively as compared with the case of using an inorganic film without requiring a complex production process, and exhibits an excellent gas barrier capability and excellent flexibility, a method for producing the gas barrier laminate, an electronic device member that includes the gas barrier laminate, and an electronic device that includes the electronic device member.

Solution to Problem

The inventors of the invention conducted extensive studies in order to achieve the above object. As a result, the inventors found that a gas barrier laminate that includes a base and a gas barrier layer, the gas barrier layer being provided on the base, the gas barrier layer being obtained by implanting ions into an organosilicon compound thin film formed by a CVD method that utilizes an organosilicon compound as a deposition raw material, exhibits an excellent gas barrier capability and excellent flexibility. This finding has led to the completion of the invention.

A first aspect of the invention provides the following gas barrier laminate (see (1) to (7)).

(1) A gas barrier laminate including a base and a gas barrier layer, the gas barrier layer being provided on the base, the gas barrier layer being obtained by implanting ions into an organosilicon compound thin film formed by a CVD method that utilizes an organosilicon compound as a deposition raw material.

(2) A gas barrier laminate including a base and a gas barrier layer, the gas barrier layer being provided on the base, the gas barrier layer being obtained by implanting ions into an organosilicon compound thin film formed by a plasma CVD method that utilizes an organosilicon compound as a deposition raw material.

(3) A gas barrier laminate including a base and a gas barrier layer, the gas barrier layer being provided on the base, the gas barrier layer being obtained by implanting ions into an organosilicon compound thin film having a refractive index of 1.46 to 1.60 and formed by a CVD method that utilizes an organosilicon compound as a deposition raw material.

(4) The gas barrier laminate according to any one of (1) to (3), wherein the ions are obtained by ionizing at least one gas selected from a group consisting of hydrogen, nitrogen, oxygen, argon, helium, neon, xenon, krypton, and a silicon compound.

(5) The gas barrier laminate according to any one of (1) to (3), wherein the ions are implanted by a plasma ion implantation method.
(6) The gas barrier laminate according to any one of (1) to (3), wherein the organosilicon compound thin film has a thickness of 30 to 500 nm.
(7) The gas barrier laminate according to any one of (1) to (3), the gas barrier laminate having a water vapor transmission rate at a temperature of 40° C. and a relative humidity of 90% of 1 g/m$^2$/day or less.

A second aspect of the invention provides the following method for producing a gas barrier laminate (see (8) and (9)).
(8) A method for producing the gas barrier laminate according to (1), the method including forming a thin film of an organosilicon compound on a base using a CVD method that utilizes an organosilicon compound as a deposition raw material, and implanting ions into the thin film.
(9) A method for producing the gas barrier laminate according to any one of (3) to (7), the method including forming a thin film having a refractive index of 1.46 to 1.60 on a base using a CVD method that utilizes an organosilicon compound as a deposition raw material, and implanting ions into the thin film.

A third aspect of the invention provides the following electronic device member (see (10)).
(10) An electronic device member including the gas barrier laminate according to any one of (1) to (7).

A fourth aspect of the invention provides the following electronic device (see (11)).
(11) An electronic device including the electronic device member according to (10).

Advantageous Effects of the Invention

The aspects of the invention thus provide a gas barrier laminate that can be produced inexpensively as compared with the case of using an inorganic film without requiring a complex production process, and exhibits an excellent gas barrier capability and excellent flexibility, a method for producing the gas barrier laminate, an electronic device member that includes the gas barrier laminate, and an electronic device that includes the electronic device member.

The method for producing a gas barrier laminate according to the second aspect of the invention can efficiently produce the gas barrier laminate according to the first aspect of the invention.

DESCRIPTION OF EMBODIMENTS

Figure 1:
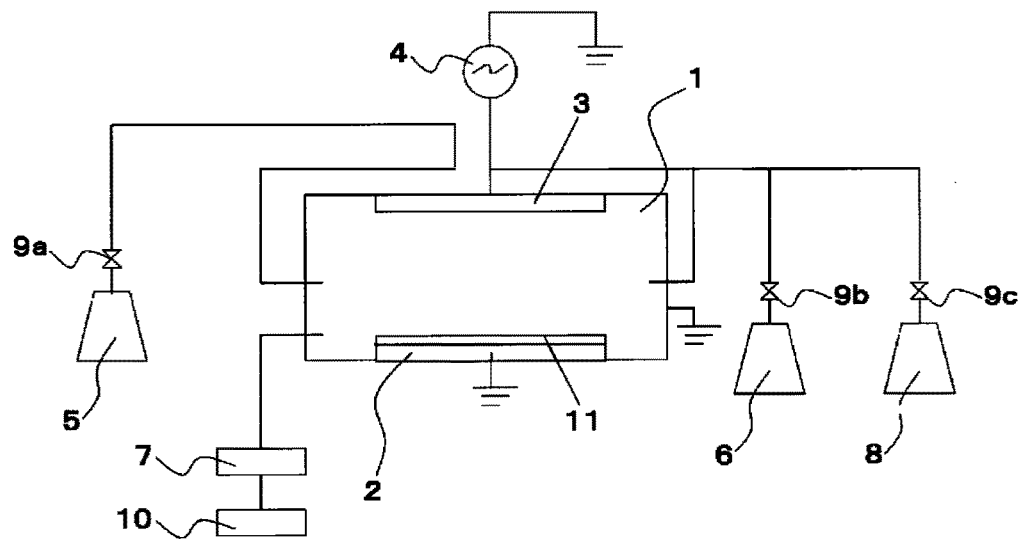
FIG. 1 is a view illustrating a schematic configuration of a plasma CVD apparatus.

A gas barrier laminate, a method for producing a gas barrier laminate, an electronic device member, and an electronic device according to the embodiments of the invention are described in detail in below.

1) Gas Barrier Laminate

A gas barrier laminate according to one embodiment of the invention includes a base and a gas barrier layer, the gas barrier layer being provided on the base, the gas barrier layer being obtained by implanting ions into an organosilicon compound thin film formed by a CVD method that utilizes an organosilicon compound as a deposition raw material.

The gas barrier laminate according to one embodiment of the invention includes the gas barrier layer that is provided on the base.

A material for forming the base is not particularly limited as long as the material is suitable for the intended use of the gas barrier laminate. Examples of the material for forming the base include synthetic resins such as polyimides, polyamides, polyamideimides, polyphenylene ethers, polyetherketones, polyether ether ketones, polyolefins, polyesters, polycarbonates, polysulfones, polyether sulfones, polyphenylene sulfides, polyallylates, acrylic resins, cycloolefin polymers, and aromatic polymers.

Among these, polyesters, polyamides, or cycloolefin polymers are preferable due to excellent flexibility and versatility. It is more preferable to use polyesters or cycloolefin polymers.

Examples of the polyesters include polyethylene terephthalate, polybuthylene terephthalate, polyethylene naphthalate, polyallylate, and the like.

Examples of the polyamides include wholly aromatic polyamides, nylon 6, nylon 66, nylon copolymers, and the like.

Examples of cycloolefin polymers include norbornene polymers, monocyclic olefin polymers, cyclic conjugated diene polymers, vinyl alicyclic hydrocarbon polymers, and hydrogenated products thereof. Specific examples of the cycloolefin polymers include Apel (ethylene-cycloolefin copolymer manufactured by Mitsui Chemicals Inc.), Arton (norbornene polymer manufactured by JSR Corporation), Zeonor (norbornene polymer manufactured by Zeon Corporation), and the like.

The thickness of the base is appropriately selected depending on the application of the gas barrier laminate, but is normally 1 to 500 μm, and preferably 10 to 200 μm.

The base may be subjected to a pretreatment such as a corona discharge treatment or a plasma treatment to remove a contaminant from the base, or activate the surface of the base.

The gas barrier layer according to one embodiment of the invention may be obtained by forming an organosilicon compound thin film on the base using a CVD method that utilizes an organosilicon compound as a deposition raw material, and implanting ions into the organosilicon compound thin film.

The organosilicon compound is not particularly limited as long as the organosilicon compound is an organic compound that includes silicon. It is preferable that the organosilicon compound further include an oxygen atom and/or a nitrogen atom.

Specific examples of the organosilicon compound include tetraalkoxysilanes such as tetramethoxysilane, tetraethoxysilane (TEOS), tetra-n-propoxysilane, tetraisopropoxysilane, tetra-n-butoxysilane, and tetra-t-butoxysilane; substituted or unsubstituted alkylalkoxysilanes such as dimethyldimethoxysilane, dimethyldiethoxysilane, diethyldimethoxysilane, methyltriethoxysilane, ethyltrimethoxysilane, and (3,3,3-trifluoropropyl)trimethoxysilane; arylalkoxysilanes such as diphenyldimethoxysilane and phenyltriethoxysilane; disiloxanes such as hexamethyldisiloxane (HMDSO); aminosilanes such as bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, and tris(dimethylamino)silane; silazanes such as hexamethyldisilazane (HMDSZ), hexamethylcyclotrisilazane, heptamethyldisilazane, nonamethyltrisilazane, octamethylcyclotetrasilazane, and tetramethyldisilazane (TMDS); cyanatosilanes such as tetraisocyanatosilane; halogenosilanes such as triethoxyfluorosilane; alkenylsilanes such as diallyldimethylsilane and allyltrimethylsilane; substituted or unsubstituted alkylsilanes such as di-t-butylsilane, 1,3-disilabutane, bis(trimethylsilyl)methane, tetramethylsilane, tris(trimethylsilyl)methane, tris(trimethylsilyl)silane, and benzyltrimethylsilane; silylalkynes such as bis(trimethylsilyl)acetylene, trimethylsilylacetylene, and 1-(trimethylsilyl)-1-propyne; silylalkenes such as 1,4-bistrimethylsilyl-1,3-butadiyne and cyclopentadienyltrimethylsilane; arylalkylsilanes such as phenyldimethylsilane and phenyltrimethylsilane; alkynylalkylsilanes such as propargyltrimethylsilane; alkenylalkylsilanes such as vinyltrimethylsilane; disilanes such as hexamethyldisilane; siloxanes such as octamethylcyclotetrasiloxane, tetramethylcyclotetrasiloxane, and hexamethylcyclotetrasiloxane; N,O-bis(trimethylsilyl)acetamide; bis(trimethylsilyl)carbodiimide; and the like.

Among these, organosilicon compounds having a boiling point at $1.01 \times 10^5$ Pa (hereinafter the same) of 40 to 200° C., more preferably 50 to 180° C., and still more preferably 60 to 170° C., are preferable from the viewpoint of a handling capability, a capability to form a film under a low degree of vacuum, a reduction in equipment cost, and a capability to allow easy film formation. It is particularly preferable to use hexamethyldisiloxane, hexamethyldisilazane, tetramethyldisilazane, or tetraethoxysilane from the viewpoint of a handling capability, versatility, and a capability to form a gas barrier layer that exhibits an excellent gas barrier capability.

The CVD (chemical vapor deposition) method is a thin film-forming technique that supplies a thin film-forming raw material (deposition raw material) to a base in a gaseous state, and decomposes the thin film-forming raw material by applying the energy of heat or plasma to effect thin film growth.

The CVD method is not particularly limited. Examples of the CVD method include a thermal CVD method, a plasma CVD method, a photo-CVD method, a laser CVD method, and the like.

Among these, the plasma CVD method is preferable since heat applied to the base can be reduced.

The plasma CVD method effects thin film growth by utilizing a gaseous plasma. The plasma CVD method basically includes causing an electrical discharge to occur through a gas that includes a raw material gas (deposition raw material) to effect decomposition under reduced pressure by applying electrical energy due to a high electrical field, and allowing the generated substance to be deposited on the base through chemical reactions in a gas phase or on the base. The plasma state is implemented by glow discharge. A method that utilizes DC glow discharge, a method that utilizes high-frequency glow discharge, a method that utilizes microwave discharge, and the like are known.

An apparatus used to implement the plasma CVD method is not particularly limited as long as the apparatus is a vacuum deposition apparatus. A parallel plate CVD apparatus is generally used to implement the plasma CVD method. A microwave CVD apparatus, an ECR-CVD apparatus, a high-density plasma CVD apparatus (helicon wave type or high-frequency induction type), or the like may also be used.

When forming the organosilicon compound thin film using the plasma CVD method, it is preferable to use an oxidizing gas or a reducing gas in combination with the organosilicon compound (raw material) in order to improve the gas barrier capability of the resulting gas barrier layer.

Examples of the oxidizing gas or the reducing gas include one gas or two or more gases selected from $O_2$, $O_3$, $NO_2$, $N_2O$, $CO_2$, CO, hydrogen, hydrocarbons, ammonia, $H_2O_2$, and the like. Among these, $O_2$ is preferable.

An inert gas such as helium, neon, argon, xenon, or krypton may be added in order to control the concentration of active species generated in plasma, and promote decomposition (dissociation) of the raw material gas. These inert gases may be used either alone or in combination.

When using the plasma CVD method, the organosilicon compound in a gaseous state may be introduced into a reaction chamber (internal pressure: 0.05 to 500 Pa (preferably 30 to 150 Pa) together with an oxidizing gas or a reducing gas (and an optional inert gas), and plasma may be generated, and deposited on the base that is disposed on the electrode by applying an electric power of 100 to 1000 W (preferably 300 to 500 W) to the electrode to form an organosilicon compound thin film.

The thickness of the resulting organosilicon compound thin film is normally 10 to 1000 nm, preferably 30 to 500 nm, and particularly preferably 100 to 300 nm. The thickness of the resulting organosilicon compound thin film can be adjusted by changing the plasma CVD time and the like. The plasma CVD time is normally 5 seconds to several minutes, and preferably 10 seconds to 4 minutes.

According to the embodiments of the invention, a gas barrier laminate that exhibits a sufficient gas barrier capability can be obtained even if the organosilicon compound thin film has a thickness at a nanometer level, by implanting ions into the organosilicon compound thin film as described later.

An organosilicon compound thin film having a refractive index within an arbitrary range can be obtained by appropriately selecting the organosilicon compound used as the deposition raw material, or appropriately selecting the plasma CVD conditions and the like.

The refractive index of the organosilicon compound thin film is preferably 1.46 to 1.60. If the refractive index of the organosilicon compound thin film exceeds 1.60, the organosilicon compound thin film may become hard, and defects such as cracks may occur. If the refractive index of the organosilicon compound thin film is less than 1.46, a uniform and high-density gas barrier layer may not be formed even if ions are implanted, and a preferable gas barrier capability or sufficient flexibility may not be obtained. When the refractive index of the organosilicon compound thin film is within the above range, a gas barrier layer that exhibits an excellent gas barrier capability and excellent flexibility can be obtained by implanting ions into the organosilicon compound thin film.

The refractive index may be measured using a known refractive index measurement apparatus (ellipsometer).

The organosilicon compound thin film formed using the plasma CVD method rarely shows occurrence of pinholes as compared with the case of using a related-art method. Therefore, a gas barrier layer that exhibits a stable gas barrier capability can be formed by utilizing such an organosilicon compound thin film.

The gas barrier layer is formed by implanting ions into the resulting organosilicon compound thin film.

Examples of the ions implanted into the organosilicon compound thin film include ions of a rare gas such as argon, helium, neon, krypton, and xenon; ions of a fluorocarbon, hydrogen, nitrogen, oxygen, carbon dioxide, chlorine, fluorine, sulfur, and the like;
ions of an alkane gas such as methane, ethane, propane, butane, pentane, and hexane; ions of an alkene gas such as ethylene, propylene, butene, and pentene; ions of an alkadiene gas such as pentadiene and butadiene; ions of an alkyne gas such as acetylene and methylacetylene; ions of an aromatic hydrocarbon gas such as benzene, toluene, xylene, indene, naphthalene, and phenanthrene; ions of a cycloalkane gas such as cyclopropane and cyclohexane; ions of a cycloalkene gas such as cyclopentene and cyclohexene; ions of conductive metals such as gold, silver, copper, platinum, nickel, palladium, chromium, titanium, molybdenum, niobium, tantalum, tungsten, and aluminum; ions of a fluorinate such as perfluorocarbon (PFC); ions of a fluorocarbon compound such as tetrafluoromethane, hexafluoroethane, 1,1,2,2-tetrafluoroethylene, 1,1,1,2,3,3-hexafluoropropane, and hexafluoropropene; ions of a fluorohydrocarbon compound such as 1,1-difluoroethylene, 1,1,1,2-tetrafluoroethane, 1,1,2,2,3-pentafluoropropane; ions of a fluorochlorohydrocarbon compound such as difluorodichloromethane and trifluorochloromethane; ions of a fluorinated alcohol such as 1,1,1,3,3,3-hexafluoro-2-propanol, 1,3-difluoro-2-propanol, and perfluorobutanol; ions of a fluorinated carboxylate such as vinyl trifluoroacetate and 1,1,1-trifluoroethyl trifluoroacetate; ions of a fluorinated ketone such as acetyl fluoride, hexafluoroacetone, and 1,1,1-trifluoroacetone; and the like.

It is preferable to use ions of at least one element/compound selected from the group consisting of hydrogen, nitrogen, oxygen, argon, helium, neon, xenon, krypton, and a silicon compound due to ease of implantation and a capability to form a gas barrier layer that exhibits a more excellent gas barrier capability and flexibility. It is particularly preferable to use ions of nitrogen, oxygen, argon, or helium.

The ion implantation dose may be appropriately determined depending on the intended use of the gas barrier laminate (e.g., the desired gas barrier capability and flexibility), and the like.

Examples of the ion implantation method include a method that applies ions (ion beams) accelerated by an electric field, a method that implants ions present in plasma (plasma ion implantation method), and the like. It is preferable to use the plasma ion implantation method since a gas barrier layer that exhibits an excellent gas barrier capability can be easily obtained.

The plasma ion implantation method is implemented by generating plasma in an atmosphere that includes a plasma-generating gas, and implanting ions (cations) present in the plasma into the surface area of the organosilicon compound thin film by applying a negative high-voltage pulse to the laminate that includes the organosilicon compound thin film that forms the surface of the laminate.

The thickness of the ion implantation layer (i.e., the layer into which the ions are implanted) may be controlled by adjusting the implantation conditions (e.g., type of ions, applied voltage, and implantation time), and may be determined depending on the thickness of the organosilicon compound thin film, the intended use of the gas barrier laminate, and the like. The thickness of the ion implantation layer is normally 5 to 1000 nm, and preferably 20 to 500 nm (from the surface of the laminate).

Whether or not the ions have been implanted into the ion implantation layer may be determined by subjecting the surface area of the organosilicon compound thin film to elemental analysis by X-ray photoelectron spectroscopy (XPS).

A gas barrier layer that has a flexible inner area, and has a surface area that is sufficiently oxidized and has high density, can be formed by implanting ions into the surface area of the organosilicon compound thin film.

Since the gas barrier layer that is obtained by implanting ions into the organosilicon compound thin film formed by the CVD method that utilizes an organosilicon compound as the deposition raw material has a flexible inner area, differing from a gas barrier layer that is formed of an inorganic compound layer, the gas barrier layer exhibits excellent flexibility, and exhibits a sufficient gas barrier capability even when the thickness of the gas barrier layer is relatively small (500 nm or less).

The shape of the gas barrier laminate according to one embodiment of the invention is not particularly limited. For example, the gas barrier laminate may be in the shape of a film, a sheet, a rectangular parallelepiped, a polygonal prism, a tube, or the like. When using the gas barrier laminate as an electronic device member (described later), the gas barrier laminate is preferably in the shape of a film or a sheet. The thickness of the film may be appropriately determined depending on the application of the electronic device.

The gas barrier laminate according to one embodiment of the invention may include only the base and the gas barrier layer, or may further include an additional layer.

Examples of the additional layer include an inorganic thin film layer, a conductive layer, an impact-absorbing layer, a primer layer, and the like.

The inorganic thin film layer is a layer that is formed of one inorganic compound or two or more inorganic compounds. The gas barrier capability of the gas barrier laminate can be further improved by providing the inorganic compound layer.

Examples of the inorganic compounds include inorganic compounds that can be deposited under vacuum, and exhibit a gas barrier capability, such as inorganic oxides, inorganic nitrides, inorganic carbides, inorganic sulfides, and composites thereof (e.g., inorganic oxynitride, inorganic oxycarbide, inorganic carbonitride, and inorganic oxycarbonitride).

The thickness of the inorganic thin film layer is normally 10 to 1000 nm, preferably 20 to 500 nm, and more preferably 20 to 100 nm.

Examples of a material for forming the conductive layer include metals, alloys, metal oxides, electrically conductive compounds, mixtures thereof, and the like.

Specific examples of the material for forming the conductive layer include antimony-doped tin oxide (ATO); fluorine-doped tin oxide (FTO); semiconductive metal oxides such as tin oxide, germanium-doped zinc oxide (GZO), zinc oxide, indium oxide, indium tin oxide (ITO), and indium zinc oxide (IZO); metals such as gold, silver, chromium, and nickel; mixtures of these metals and a conductive metal oxide; inorganic conductive substances such as copper iodide and copper sulfide; organic conductive materials such as polyaniline, polythiophene, and polypyrrole; and the like.

The conductive layer may be formed by an arbitrary method. For example, the conductive layer may be formed by evaporation (deposition), sputtering, ion plating, a thermal CVD method, a plasma CVD method, or the like.

The thickness of the conductive layer is appropriately selected depending on the application and the like. The thickness of the conductive layer is normally 10 nm to 50 µm, and preferably 20 nm to 20 µm.

The impact-absorbing layer protects the gas barrier layer when an impact is applied to the gas barrier layer. A material for forming the impact-absorbing layer is not particularly limited. Examples of the material for forming the impact-absorbing layer include acrylic resins, urethane resins, silicone resins, olefin resins, rubber materials, and the like.

A product commercially available as a pressure-sensitive adhesive, a coating material, a sealing material, or the like may also be used as the material for forming the impact-absorbing layer. It is preferable to use a pressure-sensitive adhesive (e.g., acrylic pressure-sensitive adhesive, silicone pressure-sensitive adhesive, or rubber pressure-sensitive adhesive).

The impact-absorbing layer may be formed by an arbitrary method. For example, the impact-absorbing layer may be formed by applying an impact-absorbing layer-forming solution that includes the material (e.g., pressure-sensitive adhesive) for forming the impact-absorbing layer and an optional component (e.g., solvent) to the layer on which the impact-absorbing layer is to be formed, drying the resulting film, and optionally heating the dried film.

Alternatively, the impact-absorbing layer may be formed on a release base, and transferred to the layer on which the impact-absorbing layer is to be formed.

The thickness of the impact-absorbing layer is normally 1 to 100 µm, and preferably 5 to 50 µm.

The primer layer improves the interlayer adhesion between the base and the gas barrier layer. A gas barrier laminate that exhibits excellent interlayer adhesion and surface flatness can be obtained by providing the primer layer.

An arbitrary known material may be used to form the primer layer. Examples of the material for forming the primer layer include silicon-containing compounds; a photopolymerizable composition that includes a photopolymerizable compound formed of a photopolymerizable monomer and/or a photopolymerizable prepolymer, and an initiator that generates radicals at least due to UV light; resins such as a polyester resin, a polyurethane resin (particularly a two-component curable resin that includes an isocyanate compound and a polyacryl polyol, a polyester polyol, a polyether polyol, or the like), an acrylic resin, a polycarbonate resin, a vinyl chloride/vinyl acetate copolymer, a polyvinyl butyral resin, and a nitrocellulose resin; alkyl titanates; ethyleneimine; and the like. These materials may be used either alone or in combination.

The primer layer may be formed by dissolving or dispersing the material used to form the primer layer in an appropriate solvent to prepare a primer layer-forming solution, applying the primer layer-forming solution to one side or each side of the base, drying the resulting film, and optionally heating the dried film.

The primer layer-forming solution may be applied to the base by a normal wet coating method. Examples of the wet coating method include dipping, roll coating, gravure coating, knife coating, air knife coating, roll knife coating, die coating, screen printing, spray coating, a gravure offset method, and the like.

The film formed by applying the primer layer-forming solution may be dried by hot-air drying, heat roll drying, infrared irradiation, or the like.

The thickness of the primer layer is normally 10 to 1000 nm.

Ions may be implanted into the primer layer in the same manner as described above. A gas barrier laminate that exhibits a more excellent gas barrier capability can be obtained by implanting ions also into the primer layer.

The gas barrier laminate according to one embodiment of the invention may have a configuration in which the gas barrier layer is formed on each side of the base. When the gas barrier laminate includes the additional layer, the gas barrier layer may be situated at an arbitrary position. The additional layer may be a single layer, or may include a plurality of identical or different layers.

The gas barrier laminate according to one embodiment of the invention exhibits an excellent gas barrier capability and excellent flexibility.

The gas barrier laminate according to one embodiment of the invention exhibits an excellent gas barrier capability since the gas barrier laminate has a low gas (e.g., water vapor) transmission rate. For example, the water vapor transmission rate of the gas barrier laminate is normally 5 $g/m^2/day$ or less, preferably 1 $g/m^2/day$ or less, and more preferably 0.5 $g/m^2/day$ or less. The gas (e.g., water vapor) transmission rate of the gas barrier laminate may be measured using a known gas transmission rate measurement system.

The gas barrier laminate according to one embodiment of the invention exhibits excellent flexibility since the gas barrier laminate does not produce cracks when the gas barrier laminate is wound around a stainless steel rod (diameter: 3 mm) and rotated in the circumferential direction ten times in a state in which the ion-implanted side is positioned on the outer side, and the presence or absence of cracks is determined using an optical microscope, for example.

2) Method for Producing Gas Barrier Laminate

A method for producing a gas barrier laminate according to one embodiment of the invention includes a step 1 that forms an organosilicon compound thin film on a base using a CVD method that utilizes an organosilicon compound as a deposition raw material, and a step 2 that implants ions into the organosilicon compound thin film.

It is preferable that the method for producing a gas barrier laminate according to one embodiment of the invention include a step that forms an organosilicon compound thin film having a refractive index of 1.46 to 1.60 on a base using a CVD method that utilizes an organosilicon compound as a deposition raw material, and a step that implants ions into the organosilicon compound thin film.

Step 1

The organosilicon compound thin film may be formed on the base using the CVD method by utilizing a specific organosilicon compound as the deposition raw material, and utilizing a known CVD apparatus. The plasma CVD method is preferable as the CVD method, as described above. The organosilicon compound thin film may be formed on the base using the plasma CVD method by utilizing a known plasma CVD apparatus.

An example of a method that forms the organosilicon compound thin film on the base using a plasma CVD apparatus is described below with reference to FIG. 1.

FIG. 1 schematically illustrates an example of a plasma CVD apparatus. The plasma CVD apparatus illustrated in FIG. 1 includes a reaction chamber 1 that includes an anode electrode 2, a cathode electrode 3, and a high-frequency electric power supply 4 that supplies high-frequency electric power, a container 5 that is connected to the reaction chamber 1 through a pipe, and stores an organosilicon compound, an oxidizing gas container 6, a carrier gas container 8, a vacuum pump 7 that evacuates the reaction chamber, and an exhaust duct 10. The container 5, the oxidizing gas container 6, and the carrier gas container 8 are respectively provided with flow control valves 9a, 9b, and 9c.

The reaction chamber 1 has seal-tightness sufficient to maintain the inner space under a given degree of vacuum. A base 11 is placed on the anode electrode 2 provided inside the reaction chamber 1 using a base holder (not illustrated in FIG. 1), and the inside of the reaction chamber 1 set to a given degree of vacuum using the vacuum pump 7. A reaction gas (organosilicon compound) with which the container 5 is filled is vaporized, and introduced into the reaction chamber 1 through the pipe. An oxidizing gas (e.g., oxygen ($O_2$) gas) is introduced into the reaction chamber 1 from the oxidizing gas container 6 at a given flow rate, and A carrier gas (e.g., Ar) is introduced into the reaction chamber 1 from the carrier gas container 8 at a given flow rate. The flow rate of the reaction gas is normally 1 to 100 ml/min, the flow rate of the oxidizing gas is normally 1 to 100 ml/min, and the flow rate of the carrier gas is normally 1 to 200 ml/min.

Examples of the oxidizing gas other than oxygen gas include the oxidizing gas mentioned above. Examples of the carrier gas other than Ar include the inert gas mentioned above.

After adjusting the pressure inside the reaction chamber 1 to a given value, the high-frequency electric power supply 4 is connected to the cathode electrode 3, and high-frequency electric power is applied to the reaction gas present in the reaction chamber 1, so that the reaction gas decomposes partially, and produces ions and radicals. The ions and the radicals generated from the reaction gas undergo further reactions, and are deposited on the base to form an organosilicon compound thin film.

The pressure inside the reaction chamber, the amount of electric power applied during deposition, the deposition time, and the like are preferably set to the values mentioned above in the section "1) Gas barrier laminate".

According to the embodiments of the invention, since it is unnecessary to heat the base and the like when implementing the CVD method, the organosilicon compound thin film can be easily formed.

The organosilicon compound thin film may be formed using the CVD method either batchwise or continuously.

The refractive index of the resulting organosilicon compound thin film is preferably 1.46 to 1.60.

Step 2

In the step 2, ions are implanted into the resulting organosilicon compound thin film.

Examples of the ion species used in the step 2 include those mentioned above.

The ions may be implanted into the organosilicon compound thin film either batchwise or continuously. It is preferable to implant the ions into the surface area of the organosilicon compound thin film while feeding a long base on which the organosilicon compound thin film is formed (hereinafter may be referred to as "laminate") in a given direction from the viewpoint of production efficiency.

According to the above method, the ions can be implanted into the long laminate wound around a feed-out roll while feeding the laminate in a given direction, which can then be wound around a wind-up roll, for example. Therefore, an ion-implanted gas barrier laminate can be continuously produced.

The long laminate may include an additional layer as long as the organosilicon compound thin film is formed in the surface area.

The thickness of the laminate is preferably 10 to 500 μm, and more preferably 20 to 300 μm, from the viewpoint of winding/unwinding operability and feeding operability.

The ions may be implanted into the organosilicon compound thin film by an arbitrary method. It is particularly preferable to form an ion-implanted layer in the surface area of the organosilicon compound thin film using a plasma ion implantation method.

As the plasma ion implantation method, it is preferable to use (A) a method that implants ions present in plasma generated by utilizing an external electric field into the surface area of the organosilicon compound thin film, or (B) a method that implants ions present in plasma generated due to an electric field produced by applying a negative high-voltage pulse to the organosilicon compound thin film into the surface area of the organosilicon compound thin film without using an external electric field.

When using the method (A), it is preferable to set the ion implantation pressure (plasma ion implantation pressure) to 0.01 to 1 Pa. When the plasma ion implantation pressure is within the above range, a uniform ion-implanted layer can be formed easily and efficiently. This makes it possible to efficiently form an ion-implanted layer that exhibits transparency and a gas barrier capability.

The method (B) does not require increasing the degree of decompression, allows an easy operation, and significantly reduces the processing time. Moreover, the entire organosilicon compound thin film can be uniformly processed, and ions present in plasma can be continuously implanted into the surface area of the organosilicon compound thin film with high energy when applying a negative high-voltage pulse. The method (B) also has an advantage in that an excellent ion-implanted layer can be uniformly formed in the surface area of the organosilicon compound thin film by merely applying a negative high-voltage pulse to the organosilicon compound thin film without requiring a special means such as a high-frequency electric power supply (e.g., radio frequency (RF) power supply or microwave power supply).

When using the method (A) or (B), the pulse width when applying a negative high-voltage pulse (i.e., during ion implantation) is preferably 1 to 15 μs. When the pulse width is within the above range, a transparent and uniform ion-implanted layer can be formed more easily and efficiently.

The voltage applied when generating plasma is preferably −1 to −50 kV, more preferably −1 to −30 kV, and particularly preferably −5 to −20 kV. If the applied voltage is higher than −1 kV, the ion implantation dose may be insufficient, and the desired performance may not be obtained. If the applied voltage is lower than −50 kV, unfavorable matter may occur. For example, the laminate may be unfavorably charged during ion implantation or the laminate may be unfavorably colored.

A plasma ion implantation apparatus is used when implanting ions present in plasma into the surface area of the organosilicon compound thin film.

Specific examples of the plasma ion implantation apparatus include (α) an apparatus that causes the organosilicon compound thin film (hereinafter may be referred to as "ion implantation target layer") to be evenly enclosed by plasma by superimposing high-frequency electric power on a feed-through that applies a negative high-voltage pulse to the ion implantation target layer so that ions present in the plasma are attracted to and collide with the target, and thereby implanted and deposited therein (JP-A-2001-26887), (β) an apparatus that includes an antenna in a chamber, wherein high-frequency electric power is applied to generate plasma, and positive and negative pulses are alternately applied to the ion implantation target layer after the plasma has reached an area around the ion implantation target layer, so that ions present in the plasma are attracted to and implanted into the target while heating the ion implantation target layer, causing electrons present in the plasma to be attracted to and collide with the target due to the positive pulse, and applying the negative pulse while controlling the temperature by controlling the pulse factor (JP-A-2001-156013), (γ) a plasma ion implantation apparatus that generates plasma using an external electric field utilizing a high-frequency electric power supply such as a microwave power supply, and causes ions present in the plasma to be attracted to and implanted into the target by applying a high-voltage pulse, (δ) a plasma ion implantation apparatus that implants ions present in plasma generated due to an electric field produced by applying a high-voltage pulse without using an external electric field, and the like.

It is preferable to use the plasma ion implantation apparatus (γ) or (δ) since the plasma ion implantation apparatus (γ) or (δ) allows a simple operation, significantly reduces the processing time, and can be continuously used.

A method that utilizes the plasma ion implantation apparatus (γ) or (δ) is described in WO2010/021326.

Since the plasma ion implantation apparatus (γ) or (δ) is configured so that the high-voltage pulsed power supply also serves as a plasma generation means, a special means such as a high-frequency electric power supply (e.g., RF power supply or microwave power supply) is unnecessary. An ion-implanted layer can be continuously formed by implanting ions present in the plasma into the surface area of the organosilicon compound thin film by merely applying a negative high-voltage pulse. Therefore, a gas barrier laminate in which an ion-implanted layer is formed in its surface area can be mass-produced.

3) Electronic Device Member and Electronic Device

An electronic device member according to one embodiment of the invention includes the gas barrier laminate according to one embodiment of the invention. Therefore, the electronic device member according to one embodiment of the invention exhibits an excellent gas barrier capability and excellent flexibility, and a deterioration in an element due to gas (e.g., water vapor) can be prevented. The electronic device member according to one embodiment of the invention may suitably be used as a display member for liquid crystal displays, EL displays, and the like; a solar battery back side protective sheet; and the like.

An electronic device according to one embodiment of the invention includes the electronic device member according to one embodiment of the invention. Specific examples of the electronic device include a liquid crystal display, an organic EL display, an inorganic EL display, electronic paper, a solar battery, and the like.

Since the electronic device according to one embodiment of the invention includes the electronic device member that includes the gas barrier laminate according to one embodiment of the invention, the electronic device exhibits an excellent gas barrier capability and excellent flexibility.

EXAMPLES

The invention is further described below by way of examples and comparative examples. Note that the invention is not limited to the following examples.

The following vacuum deposition apparatus (plasma CVD apparatus), plasma ion implantation apparatus, refractive index measurement apparatus, X-ray photoelectron spectroscopy (XPS) measurement apparatus, X-ray photoelectron spectroscopy measurement conditions, water vapor transmission rate measurement apparatus, water vapor transmission rate measurement conditions, and flexibility test method were used in the examples and comparative examples.

Note that an apparatus that implants ions using an external electric field was used as the plasma ion implantation apparatus.

Vacuum deposition apparatus (plasma CVD apparatus)
Reaction gas (flow rate): organosilicon compound (10 ml/min)
Introduced gas (flow rate): oxidizing gas: oxygen ($O_2$) (20 ml/min)
Carrier gas: argon (Ar) (100 ml/min)
Electric power: 400 W
Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.
Gas flow rate: 100 sccm
Duty ratio: 0.5%
Repetition frequency: 1000 Hz
Applied voltage: −25 kV
RF power supply: frequency: 13.56 MHz, applied electric power: 1000 W
Chamber internal pressure: 0.2 Pa
Pulse width: 5 μs
Processing time (ion implantation time): 300 sec
Feeding speed: 0.2 m/min
Refractive Index Measurement Apparatus
Ellipsometer: "Spectroscopic Ellipsometer 2000U" manufactured by J. A. Woollam Japan Co., Inc.
X-Ray Photoelectron Spectroscopy (XPS) Measurement Apparatus
Measurement apparatus: "PHI Quantera SXM" manufactured by ULVAC-PHI, Incorporated
X-ray beam diameter: 100 μm
Electric power: 25 W
Voltage: 15 kV
Take-off angle: 45°
Measurement of Water Vapor Transmission Rate
Water vapor transmission rate measurement apparatus: "PERMATRAN-W3/33" manufactured by Mocon
Measurement conditions: relative humidity: 90%, temperature: 40° C.
Flexibility Test Method The laminate was wound around a stainless steel rod (diameter: 3 mm) so that the polyethylene terephthalate film came in contact with the rod, and rotated ten times in the circumferential direction. The presence or absence of cracks was then determined using an optical microscope (manufactured by Keyence Corporation, magnification: 2000). A case where cracks were not observed is indicated by "None", and a case where cracks were observed is indicated by "Occurred".

Measurement of Thickness of Organosilicon Compound Thin Film

The thickness of the organosilicon compound thin film was measured using an ellipsometer ("Spectroscopic Ellipsometer 2000U" manufactured by J. A. Woollam Japan Co., Inc.)

Example 1

A polyethylene terephthalate film ("PETA-4100" manufactured by Toyobo Co., Ltd., thickness: 50 μm, hereinafter referred to as "PET film") (base) was placed on a base holder placed on the anode electrode 2 provided in the vacuum deposition apparatus (plasma CVD apparatus) illustrated in FIG. 1, and the internal pressure of the reaction chamber was set to 75 Pa. Hexamethyldisiloxane (HMDSO) (organosilicon compound) was vaporized at 50° C., and introduced into the reaction chamber together with the oxidizing gas ($O_2$) and the carrier gas (Ar).

Plasma was generated using the RF power supply, and an HMDSO thin film (thickness: 211 nm) was formed on the base (deposition time: 30 sec) to obtain a laminate 1. The refractive index of the HMDSO thin film was 1.48.

Next, argon (Ar) ions were implanted into the surface of the HMDSO thin film of the laminate 1 using the plasma ion implantation apparatus to form a gas barrier layer. A gas barrier laminate 1 was thus obtained.

Example 2

A laminate 2 was obtained in the same manner as in Example 1, except that hexamethyldisilazane (HMDSZ) was used as the organosilicon compound, the internal pressure of the reaction chamber was set to 70 Pa, the deposition time was set to 45 seconds, and an HMDSZ thin film (thickness: 209 nm) was formed on the PET film. The refractive index of the HMDSZ thin film was 1.50.

A gas barrier laminate 2 was obtained in the same manner as in Example 1, except that the laminate 2 was used.

Example 3

A laminate 3 was obtained in the same manner as in Example 1, except that tetramethyldisilazane (TMDS) was used as the organosilicon compound, the internal pressure of the reaction chamber was set to 60 Pa, the deposition time was set to 60 seconds, and a TMDS thin film (thickness: 195 nm) was formed on the PET film. The refractive index of the TMDS thin film was 1.54.

A gas barrier laminate 3 was obtained in the same manner as in Example 1, except that the laminate 3 was used.

Example 4

A laminate 4 was obtained in the same manner as in Example 1, except that tetraethoxysilane (TEOS) was used as the organosilicon compound, the internal pressure of the reaction chamber was set to 45 Pa, the deposition time was set to 180 seconds, and a TEOS thin film (thickness: 214 nm) was formed on the PET film. The refractive index of the TEOS thin film was 1.49.

A gas barrier laminate 4 was obtained in the same manner as in Example 1, except that the laminate 4 was used.

The gas barrier laminates 1 to 4 obtained in Examples 1 to 4 were subjected to elemental analysis by XPS at a depth of about 10 nm from the surface to confirm that ions were implanted into the gas barrier laminates 1 to 4. The measurement results are shown in FIGS. 2 to 5.

In FIGS. 2 to 5, the vertical axis indicates the oxygen atom content rate (%), the carbon atom content rate (%), the silicon atom content rate (%), and the nitrogen atom content rate (%) based on the total content rate (=100%) of oxygen atoms, carbon atoms, silicon atoms, and nitrogen atoms, and the horizontal axis indicates the cumulative sputtering time (min). Since the sputtering rate was constant, the cumulative sputtering time corresponds to the depth.

Figure 2:
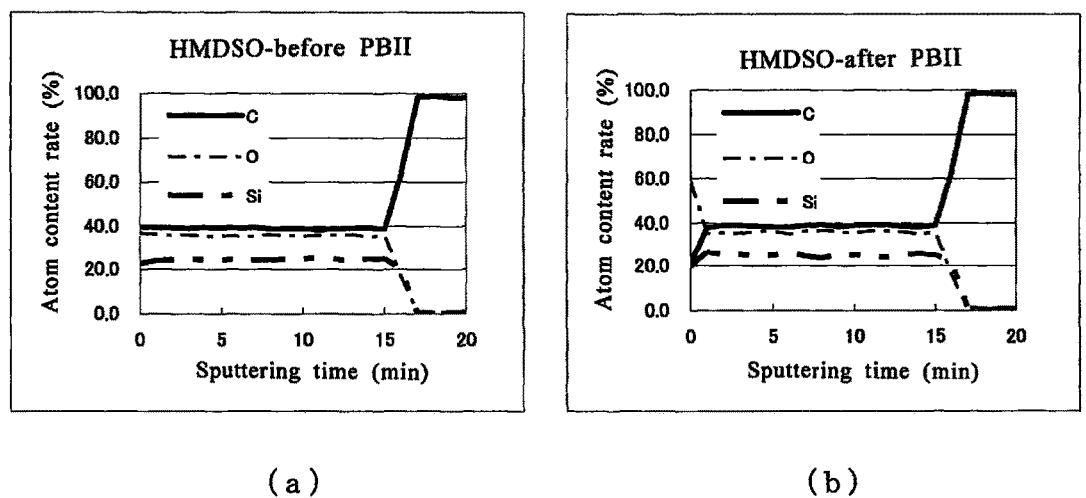
FIG. 2 is a view illustrating the oxygen atom content (%), the carbon atom content (%), and the silicon atom content (%) in the organosilicon compound thin film before and after ion implantation (Example 1).
Figure 3:
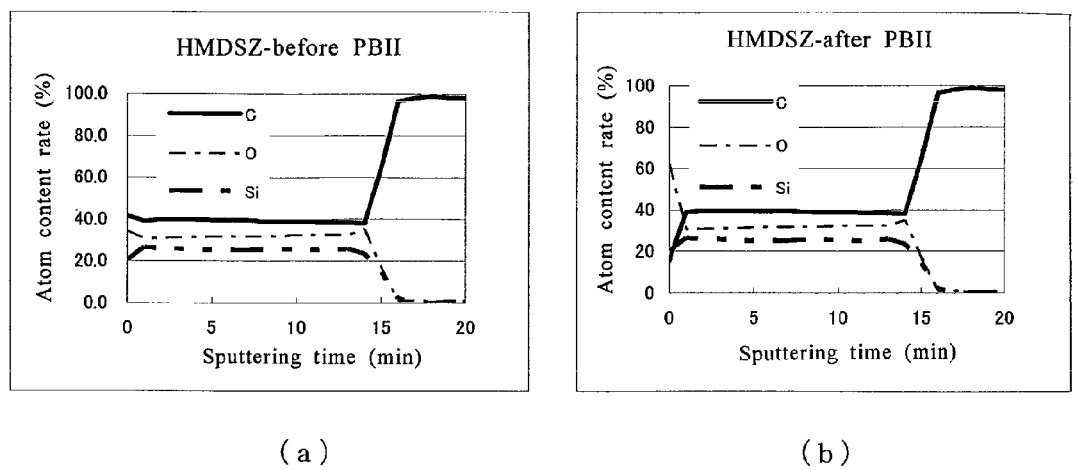
FIG. 3 is a view illustrating the oxygen atom content (%), the carbon atom content (%), the silicon atom content (%), and the nitrogen atom content (%) in the organosilicon compound thin film before and after ion implantation (Example 2).
Figure 4:
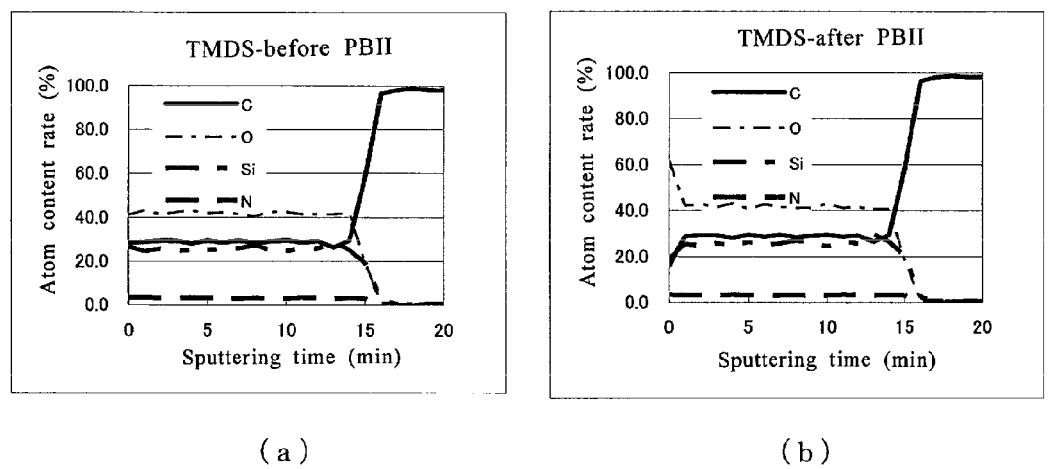
FIG. 4 is a view illustrating the oxygen atom content (%), the carbon atom content (%), the silicon atom content (%), and the nitrogen atom content (%) in the organosilicon compound thin film before and after ion implantation (Example 3).
Figure 5:
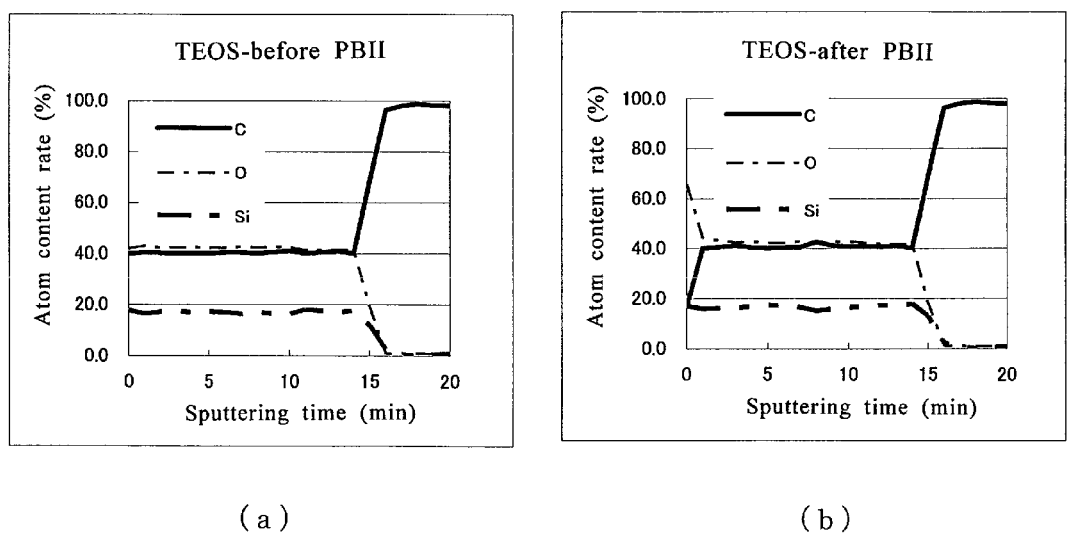
FIG. 5 is a view illustrating the oxygen atom content (%), the carbon atom content (%), and the silicon atom content (%) in the organosilicon compound thin film before and after ion implantation (Example 4).

FIG. 2 is the analysis chart of Example 1, FIG. 3 is the analysis chart of Example 2, FIG. 4 is the analysis chart of Example 3, and FIG. 5 is the analysis chart of Example 4. In FIGS. 2 to 5, (a) is the analysis chart before ion implantation, and (b) is the analysis chart after ion implantation.

As illustrated in FIGS. 2 to 5, the oxygen atom content, the carbon atom content, the silicon atom content, and the nitrogen atom content rate clearly changed due to ion implantation. It was thus confirmed that the gas barrier laminates 1 to 4 obtained in Examples 1 to 4 had a configuration in which the surface area was sufficiently oxidized, and a high-density silicon oxide film was formed in the surface area as a result of implanting ions into the surface area of the organosilicon compound thin film.

Comparative Example 1

A laminate 1r was obtained in the same manner as in Example 1, except that plasma ion implantation was not performed.

Comparative Example 2

A laminate 2r was obtained in the same manner as in Example 2, except that plasma ion implantation was not performed.

Comparative Example 3

A laminate 3r was obtained in the same manner as in Example 3, except that plasma ion implantation was not performed.

Comparative Example 4

A laminate 4r was obtained in the same manner as in Example 4, except that plasma ion implantation was not performed.

Comparative Example 5

An $SiO_2$ layer (thickness: 200 nm) was formed on a PET film by sputtering to obtain a laminate 5r. The refractive index of the $SiO_2$ layer was 1.45.

The following sputtering conditions were used.
Target: Si
Deposition gas: Ar and $O_2$
Gas flow rate: Ar: 100 ml/min, $O_2$: 60 ml/min
Deposition pressure: 0.2 Pa
Target electric power: 2500 W
Sputtering time: 210 sec

Comparative Example 6

A silicon nitride (SiN) layer (thickness: 200 nm) was formed on a PET film by sputtering to obtain a gas barrier laminate 6r. The refractive index of the silicon nitride (SiN) layer was 2.10.

The sputtering conditions were the same as those employed in Comparative Example 5, except that nitrogen was used instead of oxygen.

The gas barrier laminates 1 to 4, 5r, and 6r and the laminates 1r to 4r obtained in Examples 1 to 4 and Comparative Examples 1 to 6 were subjected to the water vapor transmission rate measurement and the flexibility test. The measurement results and the evaluation results are shown in Table 1.

TABLE 1

| | Gas barrier laminate/laminate | Water vapor transmission rate (g/m²/day) | Flexibility test |
|---|---|---|---|
| Example 1 | 1 | 0.15 | None |
| Example 2 | 2 | 0.07 | None |
| Example 3 | 3 | 0.09 | None |
| Example 4 | 4 | 0.08 | None |
| Comparative Example 1 | 1r | 9.0 | None |
| Comparative Example 2 | 2r | 9.0 | None |
| Comparative Example 3 | 3r | 9.0 | None |
| Comparative Example 4 | 4r | 9.0 | None |
| Comparative Example 5 | 5r | 0.55 | Occurred |
| Comparative Example 6 | 6r | 0.20 | Occurred |

The gas barrier laminates 1 to 4 obtained in Examples 1 to 4 had a low water vapor transmission rate and excellent flexibility. In contrast, the laminates 1r to 4r obtained in Comparative Examples 1 to 4 (in which ion implantation was not performed) had a high water vapor transmission rate (i.e., exhibited a poor gas barrier capability). The gas barrier laminates 5r and 6r obtained in Comparative Examples 5 and 6 having the gas barrier layer formed by sputtering exhibited an excellent gas barrier capability, but had poor flexibility (i.e., cracks occurred in the gas barrier layer).

INDUSTRIAL APPLICABILITY

The gas barrier laminate according to the embodiments of the invention may suitably be used for an electronic device member such as a flexible display member and a solar battery back side protective sheet.

The method for producing a gas barrier laminate according to the embodiments of the invention can safely and easily produce the gas barrier laminate according to the embodiments of the invention that exhibits an excellent gas barrier capability.

Since the electronic device member according to the embodiments of the invention exhibits an excellent gas barrier capability and excellent flexibility, the electronic device member may suitably be used for electronic devices such as displays and solar batteries.

REFERENCE SIGNS LIST

1: reaction chamber, 2: anode electrode, 3: cathode electrode, 4: high-frequency electric power supply, 5: container, 6: oxidizing gas container, 7: vacuum pump, 8: carrier gas container, 9a, 9b, 9c: flow control valve, 10: exhaust duct, 11: base

The invention claimed is:

1. A method for producing a gas barrier laminate, comprising a sheet-shaped base and a gas barrier layer formed on the base, the method comprising a step (a) of forming an organosilicon compound thin film having a refractive index of 1.49 to 1.54 and formed of an organosilicon compound on the base using a CVD method that utilizes the organosilicon compound, which comprises a silazane, as a deposition raw material, the CVD method introducing the organosilicon compound in a gaseous state into a reaction chamber having an internal pressure of 30 to 150 Pa together with an oxidizing gas and an inert gas, and generating plasma by applying an electric power of 300 to 500 W to an electrode to deposit the organosilicon compound thin film on the base that is disposed on the electrode, and a step (b) of implanting ions into the organosilicon compound thin film formed in said step (a), wherein a material for forming the base is a synthetic resin, wherein a flow rate of a reaction gas that comprises the organosilicon compound is 1 to 100 ml/min, a flow rate of the oxidizing gas is 1 to 100 ml/min, and a flow rate of a carrier gas that comprises the inert gas is 1 to 200 ml/min, and wherein the organosilicon compound thin film is a silazane thin film.

2. The method according to claim 1, wherein the ions implanted are obtained by ionizing at least one gas selected from the group consisting of hydrogen, nitrogen, oxygen, argon, helium, neon, xenon, krypton, and a silicon compound.

3. The method according to claim 1, wherein ion implantation is performed by a plasma ion implantation method.

4. The method according to claim 1, wherein the thickness Of the organosilicon compound thin film is 30-500 nm.

5. The method according to claim 1, wherein the synthetic resin is at least one resin selected from the group consisting of polyimides, polyamides, polyamideimides, polyphenylene ethers, polyetherketones, polyether ether ketones, polyolefins, polyesters, polycarbonates, polysulfones, polyether sulfones, polyphenylene sulfides, polyallylates, acrylic resins, cycloolefin polymers, and aromatic polymers.

6. The method according to claim 1, wherein the synthetic resin is at least one resin selected from the group consisting of polyesters, polyamides, and cycloolefin polymers.

7. The method according to claim 1, wherein the step (b) implants the ions into a surface area of organosilicon compound thin film while feeding the base on which the organosilicon compound thin film is formed in a given direction.

* * * * *